United States Patent
Wong et al.

[11] Patent Number: 5,903,512
[45] Date of Patent: *May 11, 1999

[54] CIRCUIT AND METHOD TO EXTERNALLY ADJUST INTERNAL CIRCUIT TIMING

[75] Inventors: Hing Wong, Los Altos, Calif.; Toshiaki Kirihata, Poughkeepsie, N.Y.; Bozidar Krsnik, St. Cloud, France

[73] Assignees: Siemens Aktiengesellschaft, Munich, Germany; International Business Machines Corporation, Armonk, N.Y.

[ * ] Notice: This patent is subject to a terminal disclaimer.

[21] Appl. No.: 08/923,593

[22] Filed: Sep. 4, 1997

Related U.S. Application Data

[63] Continuation-in-part of application No. 08/777,559, Dec. 30, 1996, Pat. No. 5,745,430.

[51] Int. Cl.⁶ .................................................. G11C 8/00
[52] U.S. Cl. .......................................... 365/233; 365/201
[58] Field of Search ...................................... 365/233, 201

[56] References Cited

U.S. PATENT DOCUMENTS

| Re. 35,065 | 10/1995 | Ohsawa ............................. | 365/193 |
|---|---|---|---|
| 5,406,522 | 4/1995 | Hirano ............................. | 365/222 |
| 5,517,462 | 5/1996 | Iwamoto et al. ................... | 365/233 |
| 5,521,878 | 5/1996 | Ohtani et al. ..................... | 365/233 |
| 5,745,430 | 4/1998 | Wong et al. ....................... | 365/233 |
| 5,751,655 | 5/1998 | Yamazaki et al. ................. | 365/233 |

*Primary Examiner*—David C. Nelms
*Assistant Examiner*—Hien Nguyen
*Attorney, Agent, or Firm*—Stanton C. Braden

[57] ABSTRACT

A circuit and method of using a test mode to control the timing of an internal signal using an external control in an integrated circuit. The test mode is designed such that the timing of the internal signal is derived from the external control which can be arbitrarily controlled by a tester. The external signal can be applied to an existing pin for chip control, provided that there is no conflict between the test mode and the operation of the integrated circuit.

30 Claims, 3 Drawing Sheets

CIRCUIT AND METHOD TO EXTERNALLY ADJUST INTERNAL CIRCUIT TIMING

CROSS REFERENCE TO RELATED APPLICATION

This is a continuation-in-part application of Ser. No. 08/777,559 filed Dec. 30, 1996. Now U.S. Pat. No. 5,745, 430.

FIELD OF THE INVENTION

The present invention generally relates to testing integrated circuits (ICs) such as dynamic random access memories (DRAMs) and, more particularly, to circuits which allow external adjustment of internal circuit timing by a tester in order to arbitrarily adjust such timings to facilitate circuit design and characterization.

BACKGROUND OF THE INVENTION

Timing in a circuit, especially delay circuits, often requires adjustment based on studies on hardware. For example, in a dynamic random access memory (DRAM), the word line (WL) turn-on to the sense amplifier (SA) set timing signal controls the signal level at which the SA starts sensing. The design of timing circuits is based on simulation of detailed circuit models. However, the actual delay time required is often unclear. In some cases, test modes are implemented to add a pre-set delay or remove a pre-set delay for adjustment. Once the circuit is designed, the range of adjustment is limited and inflexible. It is therefore advantageous to provide for arbitrarily adjusting such internal timings externally with a tester.

SUMMARY OF THE INVENTION

The present invention is related to the use of a test mode for controlling the timing of an internal signal of an integrated circuit through an external control to facilitate efficient and effective circuit design.

According to the invention, the integrated circuit is provided with different modes of operation. In one embodiment, the integrated circuit has two modes of operation, normal and test mode. A control circuit is used to determine the mode of operation of the integrated circuit. A test mode signal is provided to determine in which mode the integrated circuit operates. For example, the integrated circuit operates in the normal mode when the test mode signal is at a logic low and in the test mode when the test mode signal is at a logic high. When the integrated circuit device is in the normal mode of operation, the timing of the internal control signal is derived from an internal signal. When the integrated circuit device is in the test mode, the internal control signal is derived from an external signal provided at an external pin of the integrated circuit. In this way, the timing of the internal control signal can be externally adjusted via the test mode.

BRIEF DESCRIPTION OF THE DRAWINGS

The foregoing and other objects, aspects and advantages will be better understood from the following detailed description of the invention with reference to the drawings, in which.

DETAILED DESCRIPTION OF THE INVENTION

As previously stated, the invention is related to defining test modes for controlling the timing of internal signals using external controls. The ability to control the timing of internal signals facilitates the design of circuits. For purposes of illustration, one embodiment of the invention is described in the context of providing test modes for externally controlling the signals that operate the sense amplifier and column in a DRAM integrated circuit.

Figure 1:
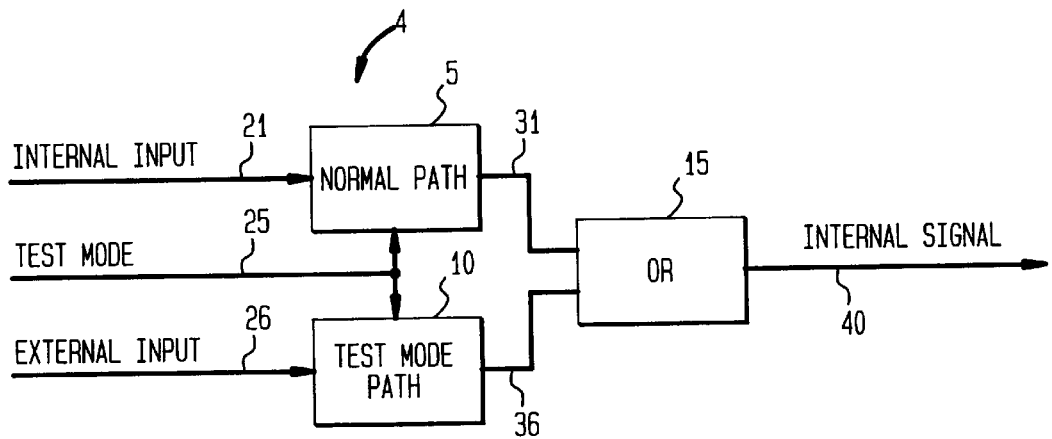
FIG. 1 is block diagram of a control circuit providing for an external control of an internal signal.

In FIG. 1, an illustrative a block diagram of a control circuit I in accordance with the invention. Control circuit 1 has two modes of operation, normal and test. In the normal mode, a normal signal path is used to control the timing of an internal signal 40. The normal signal path comprises a subcircuit 5 that is activated by an internal signal 21 and generates an output signal 31. Subcircuit 5 is, for example, a delay circuit such as a timer for producing a delayed output with respect to the input. In test mode, a test mode signal path is used for controlling the timing of internal signal 40. The test signal path comprises a subcircuit 10.

To switch the control circuit to test mode, a test mode signal is provided to subcircuit 10 for activating the test mode signal path. The test mode signal, which is also coupled to subcircuit 5, deactivates the normal mode signal path by disabling subcircuit 5. By activating the test mode signal path, output signal 31 of subcircuit 10 is derived from an external signal 26. The external signal is provided at an external pin of the integrated circuit. The external pin used to provide the external signal may serve a different function in normal mode. Alternatively, the external pin may be defined for test mode functions only. Of course any external pin of the integrated circuit may be used for inputting the external signal provided that its use does not conflict with the operation of the integrated circuit. For example, if an external pin is used to provide the power source to operate the integrated circuit, it obviously cannot be used to input the external test signal.

A subcircuit 15 receives signals 31 and 36 as input signals and outputs internal signal 40. Subcircuit 15 functions to OR signals 31 and 36 together, resulting in signal 40 to be derived from signal 31 in normal mode and signal 36 in test mode. Alternatively, subcircuit 15 may be a decoder for selecting between signal 31 and 36. Using the test mode signal as the select signal, the decoder outputs signal 31 as output signal 40 in normal mode and signal 36 as the output signal in test mode. Since the test mode signal is used as the select signal of the decoder, it is not necessary to use the test mode signal to control the operation of subcircuits 5 and 10. Thus, the control circuit enables the timing of signal 40 to be derived by an external control in test mode.

Figure 2:
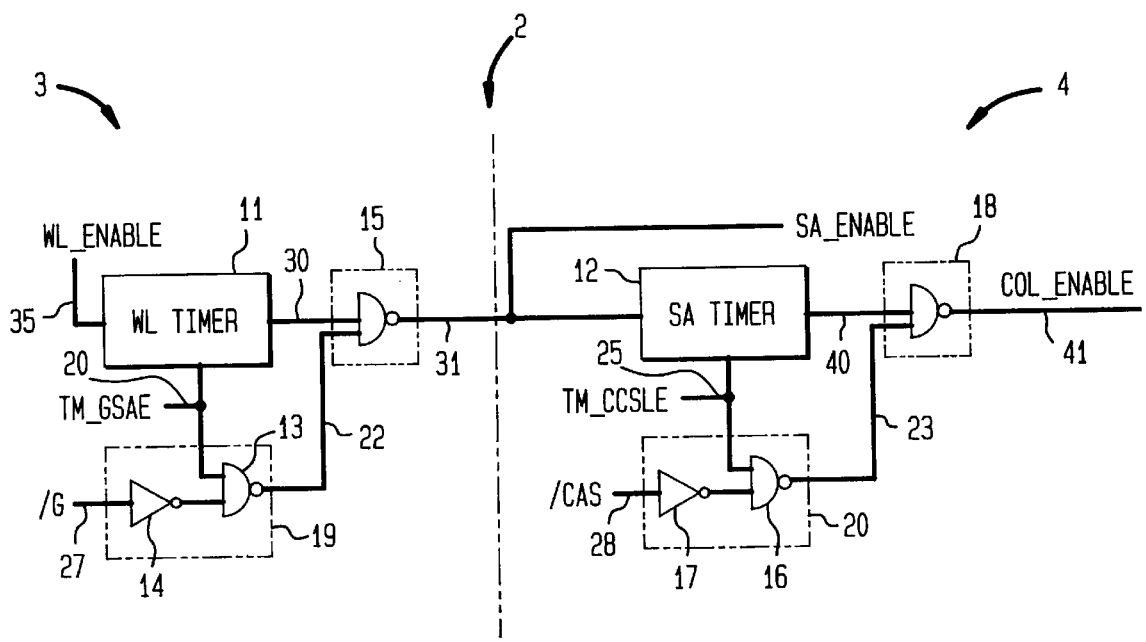
FIG. 2 is block diagram of a control circuit which provides for external control of the sense amplifier and column open timings.

FIG. 2 shows a control circuit 2 for externally controlling the timing of internal signals used for operating the SA and column in a DRAM. In general, the internal signals for operating the SA and column are SA_Enable and Col_Enable. Furthermore, the timing of the Col_Enable signal is typically dependent upon the SA_Enable signal. The timing of the SA_Enable signal is typically dependent on the WL_Enable signal, which is the internal signal used to control the WL. As shown, the control circuit comprises subcontrol (SC) circuits 3 and 4, which control the timing of SA_Enable and Col_Enable signals, respectively.

Referring to SC circuit 3, normal and test mode signal paths are provided. In the normal mode, the timing of SA_Enable is generated via the normal mode signal path. The normal test signal path includes a WL timer 11. WL timer 11 receives WL_Enable for activating and causing the WL timer to generate a delayed output signal 30. As shown, a logic high (1) WL_Enable signal activates the WL timer, causing it to generate a logic low (0) delayed output signal. The test mode signal path comprises a test mode circuit 19. A test mode signal path is coupled to the test mode circuit 19. The test mode signal, when generated, switches the DRAM to test mode by enabling the test mode circuit. In addition, the test mode signal is coupled to WL timer 11 for disabling it during test mode. As such, the test mode signal activates the test mode signal path and deactivates the normal mode signal path during test mode. Deactivation of the normal signal path results in output signal 30 of WL timer to go high. Typically, a mode register (not shown) in the DRAM generates the test mode signal. In one embodiment, the DRAM is switched to test mode by generating the test mode signal during, for example, the WCBR ($\overline{WE}$ and $\overline{CAS}$ before $\overline{RAS}$) with address for mode selection. Generation of the test mode signal during WCBR is described in Kalter et al, *A 50 ns 16 Mb DRAM with a 10 ns Data Rate*, Digest of Technical Papers, ISSCC90 (1990), which is herein incorporated by reference for all purposes. Test mode circuit 19 also receives an external test signal 27 and produces an output 22. When enabled, the test circuit effectively conducts the test signal through the test signal path.

Illustratively, test mode circuit 19 comprises an NAND gate 13 and inverter 14. The external test signal is provided at the G pin of the DRAM. The external test signal ($\overline{G}$) in the example is active low. The inverter switches the external signal to the opposite signal level. NAND gate 13, when enabled by the test mode signal, derives its output signal 31 from the input coupled to the inverter. It is clear that the inverter is used to convert the input signal to the desired signal level before the NAND gate. Of course, the external signal may be conducted through additional circuits (not shown) prior to the NAND gate. However, the example shows that the signal generated by the test mode signal path circuit 19 is, in effect, derived from the external test signal when in test mode. Since the external pin used is the G pin, the test mode signal is labeled TM_GSAE (test mode G pin SA enable). When both TM_GSAE and $\overline{G}$ signals are active, output signal 30 of NAND gate 13 becomes low.

Output signals 30 and 22 from the signal paths are coupled to select circuit 15. The select circuit outputs SA_Enable signal 31, which is derived either from signal 30 in normal mode or signal 22 in test mode. As shown, select circuit 15 comprises, for example, a NAND gate. The NAND gate generates a high output when either one of its inputs is high, but not both. Since the activated signal path generates a low signal, the output of NAND gate 15 is derived from the activated signal path. As previously mentioned, the SA_Enable is an internal signal that controls the operation of the SA. Thus, SC circuit 3 provides a test signal path from which the timing of the SA_Enable signal is controlled via an external signal during test mode.

The SA_Enable signal, which also controls the Col_Enable signal in normal mode, is coupled to SC circuit 4. Similar to SC circuit 3, SC circuit 4 comprises a normal and test signal path. The normal signal path, which is used in mode, comprises a SA timer 12. The SA timer is started by SA_Enable signal and produces an output signal 40 in response. The test mode signal path comprises a test mode signal circuit 20 similar to circuit 19 of SC circuit 3. A test mode signal 25 is generated by, for example, the onchip mode register (not shown). Test mode signal 25 deactivates the SA timer and activates a test mode circuit 20, allowing an output 23 of the test mode circuit 20 to be effectively derived from an external test signal. The external test signal is provided at an external pin such as the CAS. As the CAS pin is used, the test signal is labeled TM_CCSLE (test mode column CAS-pin select line enable). Although, illustratively, the external pin used in SC circuit 4 is different from SC circuit 3, it is not necessary that they are different. However, the use of different external control pins advantageously provides for independent control of the test modes. Test mode signal circuit 20, as shown, comprises inverter 17 and NAND gate 16. Since the test mode signal is an active low signal, the inverter is employed to switch the signal level to high. Thus, when both TM_CCSLE and test mode signal is active, output of NAND gate 16 is low.

The output signals from the test mode and normal mode signal paths 40 and 23 are fed into select circuit 18 which, for example, is a NAND gate. Select circuit 18 produces a Col_Enable signal 41 that controls the operation of the SA. The Col_Enable signal is derived from the signal path that is activated at the time. As such, SC circuit 4 enables the timing of the Col_Enable signal to be controlled by external signal.

In an alternative embodiment, select circuit 15 and/or 18 comprise a decoding circuit for selecting the output signal to be derived from the test or normal mode signal path using the test mode signal as the select signal. Implementing the select circuit with a decoding circuit eliminates the need control the timer circuits and test mode circuits with the test mode signal.

Figure 3A:
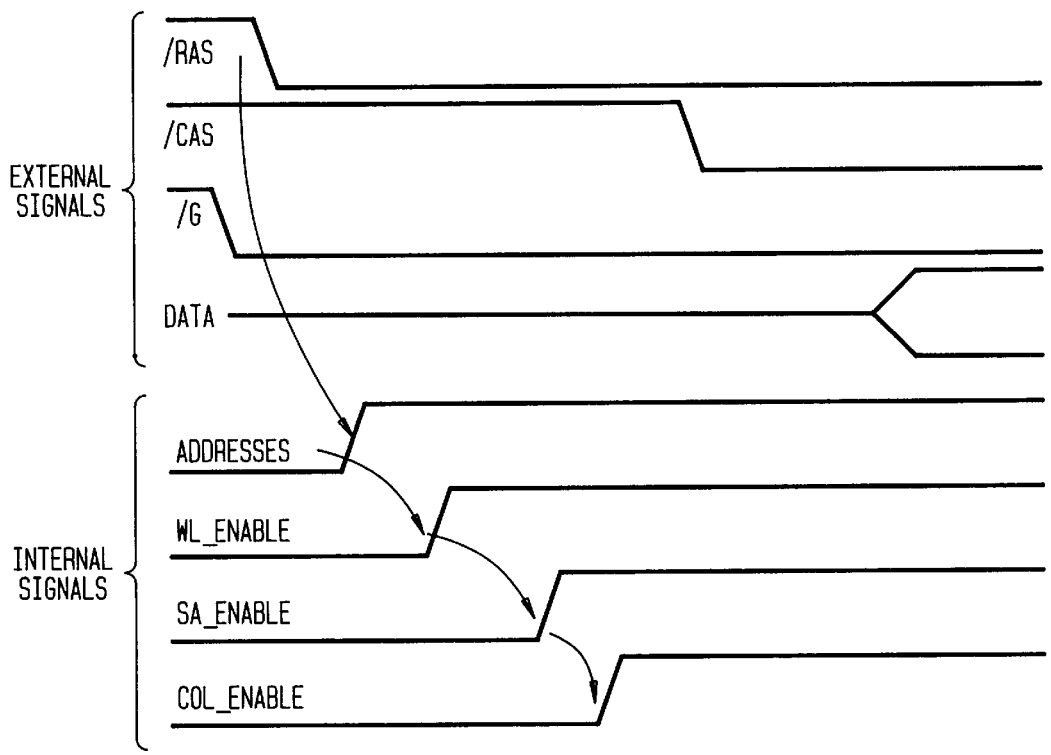
FIGS. 3A and 3B are timing diagrams which taken together are useful to understand the normal operation and test operation, respectively, the operation of the circuit shown in FIG. 2.
Figure 3B:
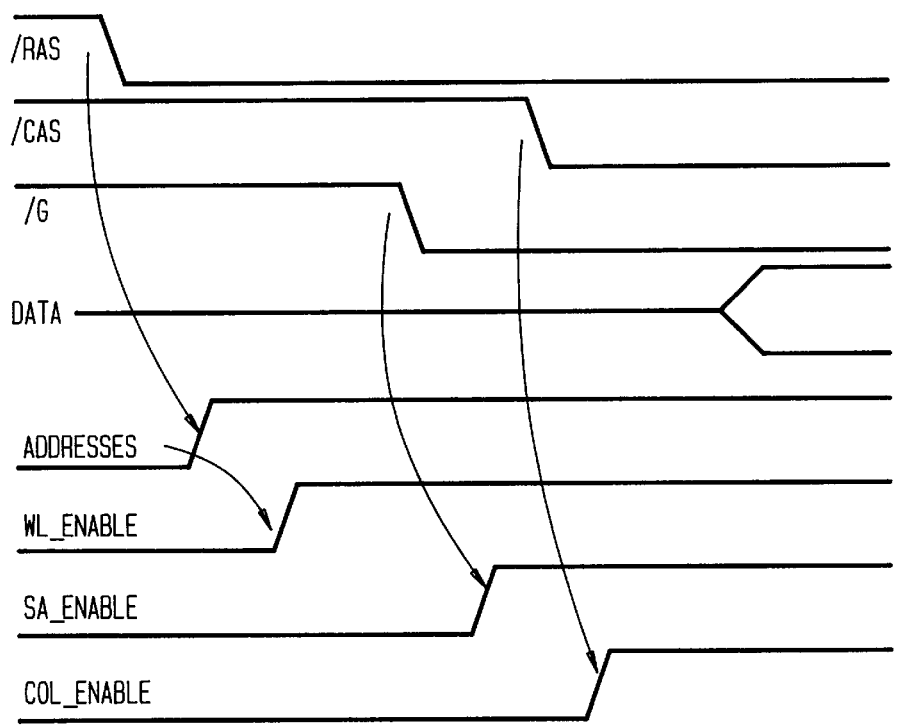

The operation of the circuit of FIG. 2 will be described with reference to FIGS. 3A and 3B which are respectively timing diagrams for normal operation and test mode operation. First, with reference to FIG. 3A, the normal signal path generating the column enable (Col_Enable) signal will be described. Typically, there are control signals, both external and internal, that generate the Col-Enable signal. The external control signals are the $\overline{RAS}$ (the row address strobe, active low), $\overline{CAS}$, $\overline{G}$, and data signals. The internal signals are addresses, WL_Enable (wordline enable), SA_Enable (sense amplifier enable), and Col_Enable (Column enable). The external strobe $\overline{RAS}$ initiates the generation of addresses which, in turn, generate the WL_Enable signal. After the timer 11 times out, the SA_Enable signal is generated, and after the timer 12 times out, the Col_Enable signal is generated.

Activating the test mode signals (TM_CSAE and TM_CCSLE) disable timers 11 and 12, causing the DRAM integrated circuit to be in test mode. Referring to FIG. 3B, timing diagram of the internal and external signals are shown. The external strobe $\overline{RAS}$ initiates the generation of addresses which, in turn, generate the WL_Enable signal, as before, but this time the SA_Enable signal is not generated by the timer 11. Instead the SA_Enable signal is generated externally by the $\overline{G}$ signal passed by NAND gate 13. This SA_Enable signal, however, does not result in the generation of the Col_Enable signal; rather, the Col_Enable signal is generated by the $\overline{CAS}$ passed by NAND gate 16.

As evident by the timing diagram, the timing of internal signals Col_Enable and SA_Enable is controlled by external signal $\overline{G}$ and $\overline{RAS}$, respectively, in test mode. The ability to control the timing of internal signals gives circuit designers essentially unlimited range of adjustments of timing delays to determine the actual delay time required in the design implementation.

The circuit shown in FIG. 1 or 2 has numerous applications. For example, the circuit can be implemented in a DRAM to adjust the timing of the WL-SA Timing by providing for a different signal path upon activation of a test mode. The different signal path, for example, causes the SA to be set with the falling edge of $\overline{G}$ and reset with the rising edge of $\overline{RAS}$.

The test mode can be used to study, for example,:
a) Minimum WL-SA delay due to WL rise time and transfer gate delay.
b) Screening of bit lines (BLs) with weak leakage by prolonging the WL-SA timing. Leaky BLs will fail if the pause time is too long.
c) Storage mode series resistance. If the storage mode series resistance is too high, a long WL-SA delay is required. If delay is independent of the distance between the cells and WL drivers, high trench resistance is suspect.

The invention can also be used to define a test mode which adjusts the SA-CSL timing, as depicted by the circuit of FIG. 2. Invocation of this test mode is achieved by using the mode register to generate the TM_CCSLE signal. The SA-CSL timing can be adjusted using the CAS (Column Address Strobe) pin. The use of separate external control signals ($\overline{G}$ and $\overline{CAS}$) allows both WL-SA timing and SA-CSL timing to be independently adjusted in one row address strobe (RAS) cycle. Choosing the CAS pin instead of the G pin allows both WL-SA timing and SA-CSL timing to be independently adjusted in one row address strobe (RAS) cycle.

A test mode for adjusting Column Address—DQ sensing timing (Query data from SA) can also be defined. Similarly, this timing can be controlled through the CAS pin. By adjusting the timing difference between addresses and the $\overline{CAS}$ edge, the column address—memory data query (DQ) sensing delay can be adjusted.

A test mode for controlling the internal clock is also useful. For example, an extra pad is added to be used to provide internal timing. The purpose of the clock is controlled by the test modes. Since this clock pad is a non-functional pad, no conflict of purpose can occur, as with the CAS or G pins. If this extra pad is connected to a non-connect pin of a package, a test mode can be used to convert the non-connect pin to a general purpose clock pin for internal timing control.

The invention can be used in either integrated circuit devices to control internal signals, such as to shift a local clock in a central processing unit (CPU) or adjust WL reset timer in a static RAM (SRAM) with selfreset. Those skilled in the art will understand that the various test modes can be used alone or in combination to achieve effective design of integrated circuit.

Figure 4:
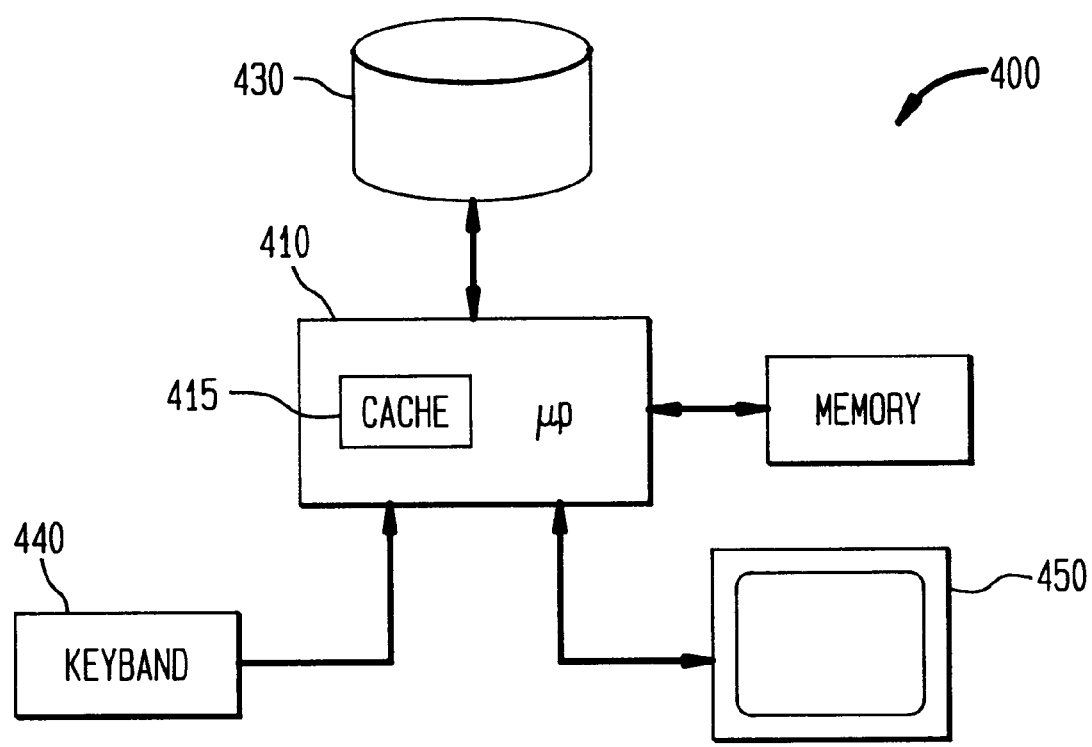
FIG. 4 shows a computer system.

Referring to FIG. 4, a typical computer system 400 is shown. As shown, the system includes a processor 410 which, for example, is a microprocessor such as those produced by Intel. The processor performs arithmetical and logical operations as provided by the processor's instruction set. Computer programs and data are stored in the computers memory storage 430. The memory storage includes magnetic or optical memory storage elements.

A keyboard 440 is provided to input commands to the system, as desired by a user. Other input device such as a mouse for inputting instructions by "point and click" technique may also be provided. The command, for example, executes a computer program stored in the computer's storage. The computer program is then loaded into the computer's memory or RAM. The RAM includes DRAM ICs such as those described in the invention. Data stored in a data file located in the computer's storage and which is required for the execution of the computer program is also transferred to the computer's RAM. Additionally, the user inputs data as required or desired, via the input device or devices.

Portion of the data and computer program that are recently or often used are stored in the computer's high speed memory 415 known as the "cache". The cache, illustratively, is part of the processor. The results of the program are then provided to the user via a display 450.

While the invention has been particularly shown and described with reference to various embodiments, it will be recognized by those skilled in the art that modifications and changes may be made to the present invention without departing from the scope of the invention. Therefore, the scope of the invention should be determined not with reference to the above description but, instead, with reference to the appended claims along with their full scope of equivalents.

What is claimed is:

1. In a computer system, a method for externally controlling the timing of an internal control signal in a RAM device, the method comprising;
    providing first and second signal paths;
    generating a test mode signal that determines a mode of operation, the RAM device being in the first mode of operation when the test mode signal is at a first signal level and being in the second mode of operation when the test mode signal is at a second signal level;
    when the RAM device is in the first mode of operation, the first signal path receives an internal signal and generates a first output signal in response to the internal signal, the first output signal being used to derive the timing of the internal control signal in the first mode of operation; and
    when the RAM device is in the second mode of operation, the second signal path receives an external signal provided at an external pin of the integrated circuit and generates a second output signal in response to the external signal, the second output signal being used to derive the timing of the internal control signal in the second mode of operation.

2. The method recited in claim 1 wherein the first signal path comprises a first circuit generating the first output in response to the internal signal.

3. The method recited in claim 2 wherein the first circuit comprises a timing circuit generating the first output having a delay with respect to the internal signal.

4. The method recited in claim 3 wherein the delay is determined by the timing circuit.

5. The method recited in claim 4 wherein the second signal path comprises a second circuit generating the second output in response to the external signal.

6. The method recited in claim 5 further comprising combining the first and second signal path with a select circuit and generating the internal control signal, the internal control signal being derived from the first output in the first mode of operation and derived from the second output in the second mode of operation.

7. The method recited in claim 6 wherein the first and second circuit responds to the test mode signal, the first circuit being enabled to activate the first signal path and the second circuit being disabled to deactivate the second signal path when the test mode signal is at the first signal level, and the first circuit being disabled to deactivate the first signal path and the second circuit being enabled to activate the second signal path when the test mode signal is at the second signal level.

8. The method recited in claim 7 wherein the select circuit performs a logical OR function.

9. The method recited in claim 8 wherein the first signal level of the test mode circuit is a logic 0 and the second signal level of the test mode circuit is a logic 1.

10. The method recited in claim 9 wherein the second circuit performs a logical AND function and, in response to the test mode signal and the external signal, generates the second output.

11. The method recited in claim 6 wherein said select circuit comprises a decoder for receiving the test mode signal and the first and second outputs, the decoder generating the internal control signal in response to the test mode signal, the internal control signal being derived from the first output when the test mode signal is at the first signal level and from the second output when the test mode signal is at the second signal level.

12. The method recited in claim 1 wherein the external pin is used for a different functional purpose during the first mode of operation and receives the external signal for deriving the timing of the internal control signal during the second mode of operation.

13. The method recited in claim 9 wherein the RAM device comprises a dynamic random access memory (DRAM) device, the internal signal is used to enable a wordline, and the internal control signal is used to enable a sense amplifier.

14. The method recited in claim 13 wherein the external pin comprises a G pin of the DRAM device.

15. The method recited in claim 9 wherein the RAM device comprises a DRAM device, the internal signal is used to enable a sense amplifier and the internal control signal is used to enable a column.

16. The method recited in claim 15 wherein the external pin comprises a CAS pin of the DRAM device.

17. A RAM device including a control circuit for controlling a timing of an internal control signal using an external control, the control circuit comprising:

a first subcircuit receiving a test mode signal, the first subcircuit generating a first output in response to an internal signal when the test mode signal is at a first signal level;

a second subcircuit receiving the test mode signal, the second subcircuit generating a second output in response to an external signal when the test mode signal is at a second signal level;

a select circuit receiving the first and second outputs and generating the internal control signal, the internal control signal being derived from the first output when the test mode signal is at the first signal level and from the second output when the test mode signal is at the second level.

18. The control circuit recited in claim 17 wherein the first subcircuit comprises a timing circuit for generating the first output having a delay with respect to the internal control signal.

19. The control circuit recited in claim 18 wherein the delay is predetermined by the timing circuit.

20. The control circuit recited in claim 19 wherein the second subcircuit generates the second output which is derived from the external signal when the test mode signal is at the second level.

21. The control circuit recited in claim 20 wherein the first and second subcircuit respond to the test mode signal, the test mode signal, when at the first signal level, enables the first subcircuit to permit the generation of the first output and disables the second subcircuit to prevent the generation of the second output, and when in the second signal level, disables the first subcircuit to prevent the generation of the first output and enables the second subcircuit to permit the generation of the second output.

22. The control circuit recited in claim 21 further comprising a select circuit, the select circuit receives the first and second outputs and generates the internal control signal, the internal control signal being derived from the first output when the test mode signal is at the first signal level and from the second output when the test mode signal is at the second signal level.

23. The control circuit recited in claim 22 wherein the select circuit performs a logical OR function in response to the first and second outputs.

24. The control circuit recited in claim 23 wherein the first level of the test mode signal is a logic 0 and the second level of the test mode signal is a logic 1.

25. The control circuit recited in claim 24 wherein the first subcircuit performs a logical AND function in response to the test mode and external signals.

26. The control circuit recited in claim 25 wherein the external pin is used for a different functional purpose when the test mode is at the first signal level and at the second signal level.

27. The control circuit recited in claim 25 wherein the RAM device comprises a DRAM device, the internal signal is used to enable a wordline, and the internal control signal is used to enable a sense amplifier.

28. The control circuit recited in claim 27 wherein the external pin comprises a G pin of the DRAM device.

29. The control circuit recited in claim 25 wherein the RAM device comprises a DRAM device, the internal signal is used to enable a sense amplifier, and the internal control signal is used to enable a column.

30. The control circuit recited in claim 27 wherein the external pin comprises a CAS pin of the DRAM device.

* * * * *